United States Patent
Chen et al.

(10) Patent No.: US 8,872,787 B2
(45) Date of Patent: Oct. 28, 2014

(54) HANDHELD APPARATUS

(75) Inventors: Ming-Yu Chen, Taoyuan County (TW); Fu-Chiang Chou, Taoyuan County (TW)

(73) Assignee: HTC Corporation, Taoyuan County (TW)

( * ) Notice: Subject to any disclaimer, the term of this patent is extended or adjusted under 35 U.S.C. 154(b) by 798 days.

(21) Appl. No.: 12/886,576

(22) Filed: Sep. 21, 2010

(65) Prior Publication Data
US 2011/0261004 A1 Oct. 27, 2011

(30) Foreign Application Priority Data

Apr. 27, 2010 (TW) .............................. 99113293 A

(51) Int. Cl.
G06F 3/045 (2006.01)
G09G 5/10 (2006.01)
H03K 17/96 (2006.01)

(52) U.S. Cl.
CPC ................................. H03K 17/9645 (2013.01)
USPC .......................................... 345/174; 345/690

(58) Field of Classification Search
CPC ....... G06F 3/038; G06F 3/0383; G09G 1/005; G09G 1/007; G09G 1/02; G09G 2330/00; G09G 2340/00
USPC ......... 345/174, 178; 307/116; 340/692, 686.1
See application file for complete search history.

(56) References Cited

U.S. PATENT DOCUMENTS

| 3,828,205 A | 8/1974 | Konopka |
| 5,409,239 A | 4/1995 | Tremmel |
| 2002/0109416 A1* | 8/2002 | Lewis et al. .................... 307/116 |
| 2006/0042919 A1* | 3/2006 | Chu ............................... 200/262 |
| 2008/0094349 A1* | 4/2008 | Liao et al. ...................... 345/102 |
| 2009/0314551 A1 | 12/2009 | Nakajima |

FOREIGN PATENT DOCUMENTS

| CN | 2909388 | 6/2007 |
| TW | 200951789 | 12/2009 |
| TW | 201001262 | 1/2010 |

OTHER PUBLICATIONS

"First Office Action of China Counterpart Application", issued on Oct. 10, 2012, p. 1-p. 5.
"Search Report of European Counterpart Application", issued on Feb. 4, 2011, p. 1-p. 3.
"First Office Action of European Counterpart Application", issued on Feb. 17, 2011, p. 1-p. 5, in which US20020109416, US5409239, and US20060042919.
"Office Action of Taiwan Counterpart Application", issued on Jun. 14, 2013, p. 1-p. 4.

* cited by examiner

*Primary Examiner* — Michael Faragalla
(74) *Attorney, Agent, or Firm* — Jianq Chyun IP Office

(57) ABSTRACT

A handheld apparatus is provided. The handheld apparatus includes a first touch pad, a second touch pad, an impedance unit, and a microprocessor. When an input tool touches the first touch pad and the second touch pad simultaneously, a touch voltage signal is generated on a common contact of the second touch pad and the impedance unit, wherein the resistance of the impedance unit is greater than that of the input tool. The microprocessor executes a specific function according to the touch voltage signal.

13 Claims, 3 Drawing Sheets

HANDHELD APPARATUS

CROSS-REFERENCE TO RELATED APPLICATION

This application claims the priority benefit of Taiwan application serial No. 99113293, filed on Apr. 27, 2010. The entirety of the above-mentioned patent application is hereby incorporated by reference herein and made a part of this specification.

BACKGROUND OF THE INVENTION

1. Field of the Invention

The present invention generally relates to a handheld apparatus, and more particularly, to a touch sensing apparatus of a handheld apparatus.

2. Description of Related Art

Along with the development of technologies, touch sensing apparatuses have been broadly used and brought a lot of convenience to our daily life. A user can execute various functions provided by a touch sensing apparatus by simply touching the touch sensing apparatus. Thus, the user's operation is made very simply.

Taking touch phones as an example, capacitive touch sensing apparatus is one of the most common touch sensing apparatuses presently adopted by touch phones. In a capacitive touch sensing apparatus, sensing capacitors are constantly charged and variations in the voltage levels of the sensing capacitors are detected, so as to determine whether the position corresponding to a sensing capacitor is touched. A capacitive touch sensing apparatus may be interfered by the sweat on the user's hand or electromagnetic waves. As a result, the touch panel thereof may perform some operations incorrectly, such as mistakenly opening or closing some programs. Obviously, such incorrect operations will trouble the user unnecessarily.

In addition, because the sensing capacitors have to be constantly charged, a lot of power is consumed and the standby and working time of the touch phone is shortened.

SUMMARY OF THE INVENTION

Accordingly, the present invention is directed to a handheld apparatus and a touch sensing apparatus thereof, wherein the power consumption of the touch sensing apparatus is greatly reduced and accordingly the working time of the handheld apparatus is prolonged.

The present invention provides a handheld apparatus including at least one first touch pad, at least one second touch pad, at least one impedance unit, and a microprocessor. The first touch pad is coupled to a first reference voltage. The impedance unit is coupled between the second touch pad and a second reference voltage. When an input tool touches the first touch pad and the second touch pad simultaneously, a touch voltage signal is generated on the common contact of the second touch pad and the impedance unit, wherein the resistance of the impedance unit is greater than that of the input tool. The microprocessor is coupled to the second touch pad, and which executes a specific function according to the touch voltage signal.

According to an embodiment of the present invention, the handheld apparatus further includes a voltage supply unit coupled to the microprocessor. The voltage supply unit generates the first reference voltage and the second reference voltage and turns on or off the first reference voltage and the second reference voltage under the control of the microprocessor.

According to an embodiment of the present invention, the handheld apparatus further includes a timing unit coupled to the microprocessor. The microprocessor controls the timing of the first reference voltage and the second reference voltage generated by the voltage supply unit according to a time period counted by the timing unit.

According to an embodiment of the present invention, the handheld apparatus further includes at least one current-limiting protection unit. The current-limiting protection unit is coupled between the first reference voltage and the first touch pad for limiting the quantity of current flowing towards the first touch pad.

According to an embodiment of the present invention, the handheld apparatus further includes at least one logic gate. The logic gate is coupled between the corresponding second touch pad and the microprocessor for enhancing the driving capability of the touch voltage signal and providing electrostatic discharge (ESD) protection.

According to an embodiment of the present invention, the handheld apparatus further includes at least one analog-to-digital converter (ADC). The ADC is coupled between the corresponding second touch pad and the microprocessor for converting the touch voltage signal corresponding to the second touch pad into a digital signal.

According to an embodiment of the present invention, the handheld apparatus further includes a body. The body has a first surface, and the first touch pads and the second touch pads are alternatively disposed on the first surface.

According to an embodiment of the present invention, the handheld apparatus further includes a body. The body has a second surface and a third surface opposite to each other, and the first touch pad and the second touch pad are respectively disposed on the second surface and the third surface.

According to an embodiment of the present invention, the body further has a fourth surface and a fifth surface opposite to each other. The fourth surface adjoins the second surface and the third surface, the fifth surface also adjoins the second surface and the third surface, and another first touch pad and another second touch pad are respectively disposed on the fourth surface and the fifth surface.

According to an embodiment of the present invention, the current-limiting protection unit includes a first resistor.

According to an embodiment of the present invention, the resistance of the impedance unit is greater than the sum of the resistances of the current-limiting protection unit and the input tool.

According to an embodiment of the present invention, the first reference voltage is greater than the second reference voltage, and the touch voltage signal rises from a logic low level to a logic high level.

According to an embodiment of the present invention, the first reference voltage is smaller than the second reference voltage, and the touch voltage signal falls from a logic high level to a logic low level.

According to an embodiment of the present invention, the logic gate is an inverter.

According to an embodiment of the present invention, the impedance unit includes a second resistor.

According to an embodiment of the present invention, the input tool is a finger.

As described above, in the present invention, a first touch pad, a separated second touch pad, and an impedance unit having a resistance greater than that of the input tool are adopted such that the power consumption is reduced. No current is passed through the first and the second touch pad, and power is consumed only when the input tool touches the first touch pad and the second touch pad simultaneously. Thereby, the working and standby time of a handheld apparatus is prolonged.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
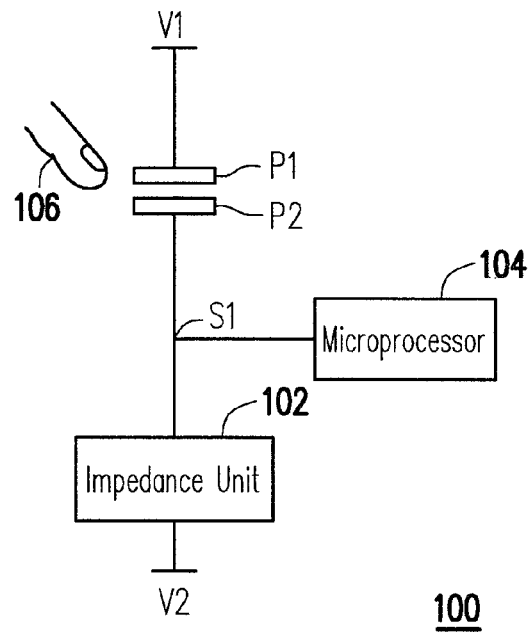
FIG. 1 is a block diagram of a touch sensing apparatus according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram of a touch sensing apparatus according to an embodiment of the present invention. Referring to FIG. 1, the touch sensing apparatus 100 includes a touch pad P1, a touch pad P2, an impedance unit 102, and a microprocessor 104. The touch pad P1 is coupled to a reference voltage V1. The impedance unit 102 is coupled between the touch pad P2 and a reference voltage V2. The microprocessor 104 is coupled to the touch pad P2.

When an input tool 106 (for example, a finger) having a resistance smaller than that of the impedance unit 102 touches the touch pad P1 and the touch pad P2 simultaneously, the touch pad P1 and the touch pad P2 are turned on, so that the voltage level of a touch voltage signal S1 on the common contact of the touch pad P2 and the impedance unit 102 is changed. The microprocessor 104 receives the touch voltage signal S1 and executes a specific function according to the variation in the voltage level of the touch voltage signal S1. When the input tool 106 does not touch the touch pad P1 and the touch pad P2 simultaneously, the touch pad P1 and the touch pad P2 form an open circuit such that the touch sensing apparatus 100 does not consume any power. Thus, unlike the conventional capacitive touch sensing apparatus in which the sensing capacitors are constantly charged, the touch sensing apparatus in the present embodiment consumes less power. It should be noted that the input tool 106 in the present embodiment is not limited to a finger, and any conductive object having a resistance smaller than that of the impedance unit 102 can be served as the input tool 106.

Figure 2:
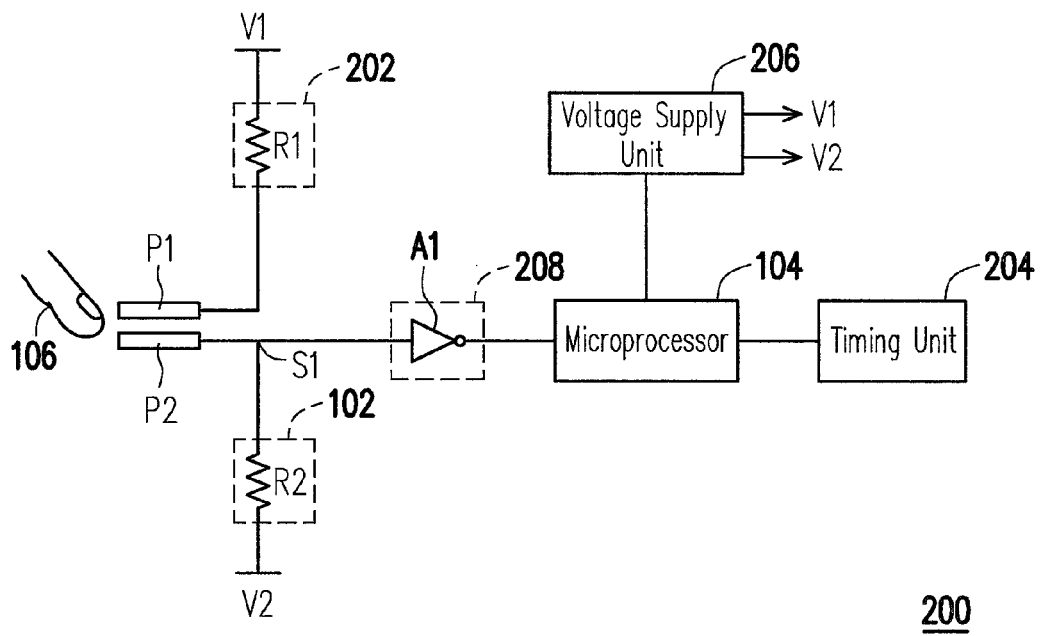
FIG. 2 is a block diagram of a touch sensing apparatus according to another embodiment of the present invention.

FIG. 2 is a block diagram of a touch sensing apparatus according to another embodiment of the present invention. Referring to FIG. 2, the difference between the touch sensing apparatus 200 in the present embodiment and the touch sensing apparatus 100 illustrated in FIG. 1 is that the touch sensing apparatus 200 further includes a current-limiting protection unit 202, a timing unit 204, a voltage supply unit 206, and a logic gate 208.

The current-limiting protection unit 202 is coupled between the reference voltage V1 and the touch pad P1. The impedance unit 102 is coupled between the touch pad P2 and the reference voltage V2. The voltage supply unit 206 is coupled to the microprocessor 104. The logic gate 208 is coupled between the touch pad P2 and the microprocessor 104. The timing unit 204 is coupled to the microprocessor 104. In the present embodiment, the reference voltage V1 is a supply voltage, the reference voltage V2 is a ground voltage, the current-limiting protection unit 202 is a resistor R1, the impedance unit 102 is a resistor R2, and the logic gate 208 is an inverter A1 composed of metal oxide semiconductor field effect transistors (MOSFETs). The resistance of the resistor R2 is greater than the sum of the resistances of the resistor R1 and the input tool 106. For example, the resistance of the resistor R1 is 1KΩ, the resistance of the resistor R2 is 30MΩ, and the input tool 106 is a finger (the resistance thereof is between 1MΩ and 20MΩ).

When the input tool 106 does not touch the touch pad P1 and the touch pad P2 simultaneously, the touch pad P1 and the touch pad P2 form an open circuit such that no current is passed through the touch pads P1 and P2 and no power is consumed by the touch sensing apparatus 200. Thus, compared to a conventional capacitive touch sensing apparatus in which power has to be constantly supplied to the sensing capacitors, the touch sensing apparatus 200 consumes much less power. Herein the voltage level of the touch voltage signal S1 is equal to that of the ground voltage. Namely, the touch voltage signal S1 is at a logic low level.

It should be noted that in an actual application, the touch pad P1 may be short-circuited therefore directly grounded. As a result, the touch sensing apparatus 200 may be damaged due to the overlarge current. In this case, the resistor R1 (i.e., the current-limiting protection unit 202) limits the quantity of current flowing towards the touch pad P1 so as to prevent the touch pad P1 from being directly grounded and the touch sensing apparatus 200 from being damaged. However, it is not necessary to dispose the current-limiting protection unit 202 between the reference voltage V1 and the touch pad P1 if the touch pad P1 will never be short-circuited in an actual application.

When the input tool 106 touches the touch pad P1 and the touch pad P2 simultaneously, the touch pad P1 and the touch pad P2 are electrically connected. In this case, the voltage level of the touch voltage signal S1 is equal to the supply voltage on the resistor R2. Because the resistance of the resistor R2 is greater than the total resistance of the resistor R1 and the input tool 106, most part of the voltage drop falls on the resistor R2 so that the touch voltage signal S1 rises from the original logic low level to a logic high level. Thus, the microprocessor 104 executes a specific function according to the touch voltage signal S1. For example, if the touch sensing apparatus 200 is deployed in a handheld apparatus (for example, a cell phone), the microprocessor 104 turns on the backlight module of the display panel, so as to display images, according to the voltage variation of the touch voltage signal S1.

It should be noted that even though in the embodiment illustrated in FIG. 2, the reference voltage V1 is assumed to be a supply voltage and the reference voltage V2 is assumed to be the ground voltage, an actual application of the present invention is not limited thereto. In other embodiments of the present invention, the reference voltage V2 may also be greater than the reference voltage V1 (for example, the reference voltage V1 is a ground voltage and the reference voltage V2 is a supply voltage). In this case, when the input tool 106 touches the touch pad P1 and the touch pad P2 simultaneously, the touch voltage signal S1 falls from a logic high level to a logic low level. Even though the variation in the logic voltage level is different, the working principle is the same as that described in the embodiment illustrated in FIG. 2 therefore will not be described herein again. Similarly, the microprocessor 104 also executes a specific function according to the voltage variation of the touch voltage signal S1.

Additionally, the reference voltage V1 and the reference voltage V2 in FIG. 2 are generated by the voltage supply unit 206. The voltage supply unit 206 turns on or off the reference voltage V1 and the reference voltage V2 under the control of the microprocessor 104. The microprocessor 104 controls the timing of the reference voltages V1 and V2 generated by the voltage supply unit 206 according to a time period counted by the timing unit 204, so that the reference voltages V1 and V2 can be turned on only when the touch sensing apparatus 200 is needed. For example, if the touch sensing apparatus 200 is deployed in a handheld apparatus (for example, a cell phone), it can be configured that the reference voltages V1 and V2 are turned on once every second when the handheld apparatus is in a power-saving mode or a sleep mode, so as to reduce the power consumed.

Figure 3:
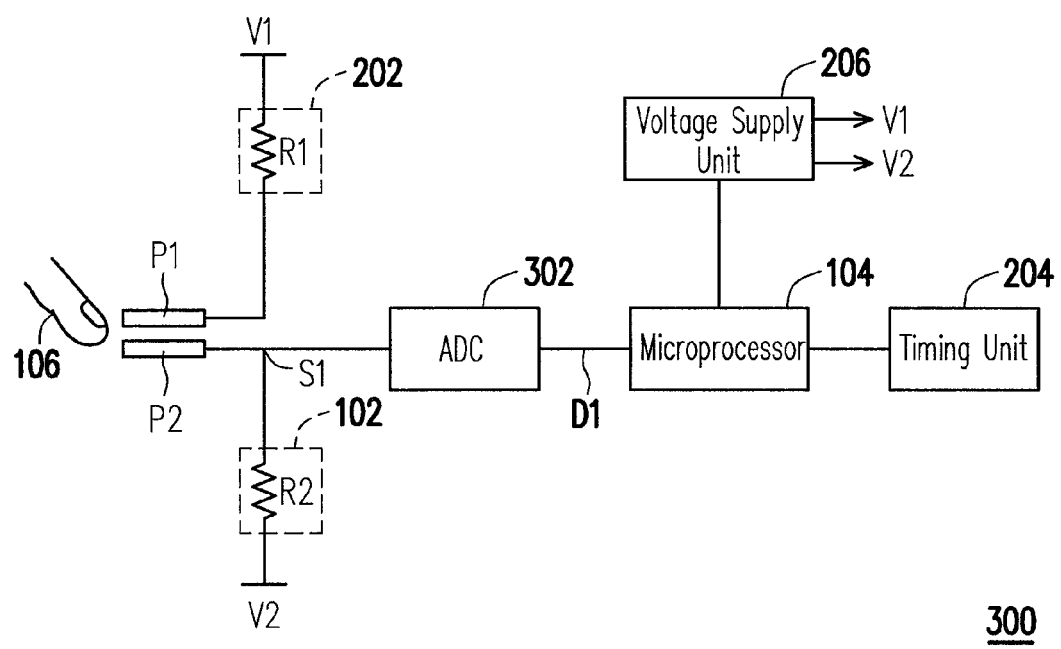
FIG. 3 is a block diagram of a touch sensing apparatus according to yet another embodiment of the present invention.

The inverter A1 (i.e., the logic gate 208) in FIG. 2 provides an electrostatic discharge (ESD) protection function, and which also enhances the driving capability of the touch voltage signal S1, so as to trigger the microprocessor 104 to execute the specific function. In other embodiments of the present invention, the logic gate 208 may be replaced by an analog-to-digital converter (ADC). FIG. 3 is a block diagram of a touch sensing apparatus 300 according to yet another embodiment of the present invention. As shown in FIG. 3, the ADC 302 is coupled between the touch pad P2 and the microprocessor 104. The ADC 302 converts the voltage variation of the touch voltage signal S1 into a digital signal D1 such that the microprocessor can execute a specific function according to the digital signal D1.

For example, if the touch sensing apparatus 300 is deployed in a handheld music playing apparatus (for example, a MP3 player), when a user holds the handheld apparatus tightly with his hand, the resistance of the user's hand decreases and accordingly the voltage level of the touch voltage signal S1 increases. After the ADC 302 converts the increased voltage level into a digital signal D1, the microprocessor 104 adjusts the playing effect (for example, the volume) of the music player according to the digital signal D1. Namely, the playing effect (volume) of the music player can be adjusted according to the power used by the user for holding the music player.

Figure 4A:
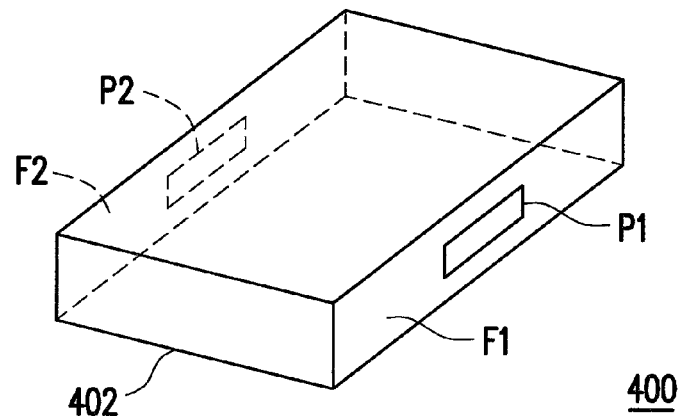
FIGS. 4A-4C are diagrams of a handheld apparatus according to an embodiment of the present invention.
Figure 4B:
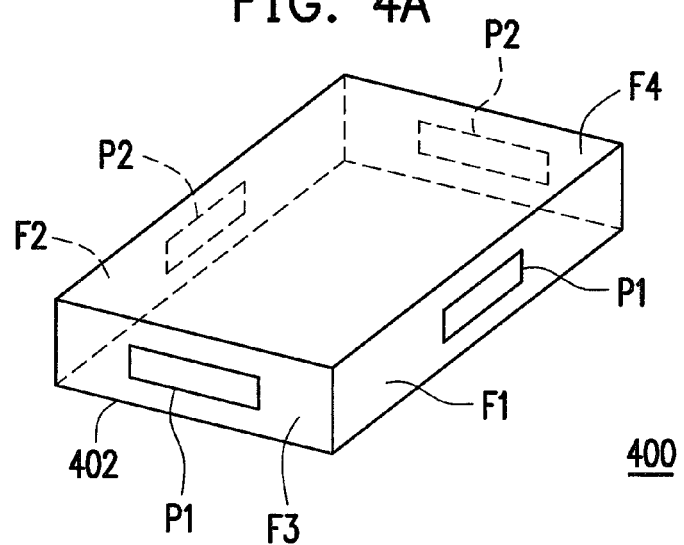
Figure 4C:
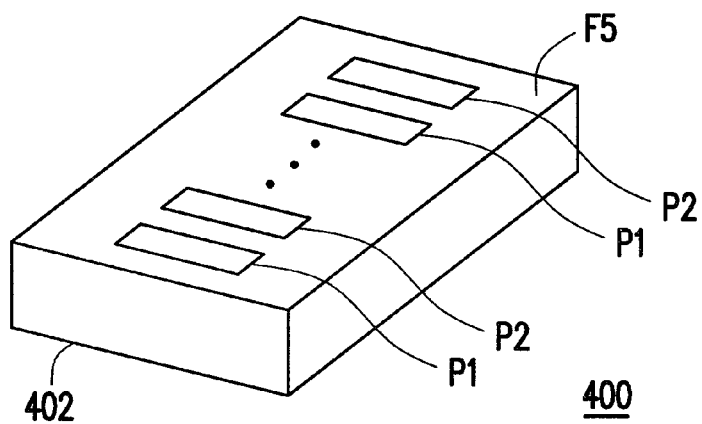

As described above, the touch sensing apparatus may be deployed into different handheld apparatus (for example, a cell phone or a MP3 player, etc), and different interactive effect between a handheld apparatus and a user can be achieved along with different number and disposed positions of touch sensing apparatuses deployed in the handheld apparatus. FIGS. 4A-4C are diagrams of a handheld apparatus according to an embodiment of the present invention. Herein the handheld apparatus in FIGS. 4A-4C is assumed to be a smart phone with game and camera functions. However, the present invention is not limited thereto. Referring to FIGS. 4A-4C, the handheld apparatus 400 includes a body 402. The body 402 has surfaces F1 and F2 and surfaces F3 and F4 that are respectively opposite to each other. The surface F1 adjoins the surfaces F3 and F4, the surface F2 also adjoins the surfaces F3 and F4, and the surface F5 adjoins all the surfaces F1-F4. In FIG. 4A, the touch pads P1 and P2 are respectively disposed on the surfaces F1 and F2. Assuming that the cell phone in FIG. 4A is in a sleep state, when a user takes up the body 402 of the handheld apparatus with his hand, the user can wake up the cell phone from the sleep mode by simultaneously touching the touch pads P1 and P2 on the surfaces F1 and F2 to generate the touch voltage signal S1.

In FIG. 4B, a touch pad P1 is respectively disposed on the surfaces F1 and F3, and a touch pad P2 is respectively disposed on the surface F2 and F4. When the user takes up the cell phone and touches the touch pads P1 and P2 on the surfaces F1 and F2 simultaneously, the microprocessor 104 receives a touch voltage signal S1 corresponding to the surfaces F1 and F2. When the user takes up the cell phone and touches the touch pads P1 and P2 on the surfaces F3 and F4 simultaneously, the microprocessor 104 receives the touch voltage signal S1 corresponding to the surfaces F3 and F4. The microprocessor 104 allows the cell phone to interact with the user differently (for example, entering different function mode, such as a game mode or a camera mode, or changing the orientation of the displayed content) according to the touch voltage signal S1 received from different source. Since the user does not need to perform any other operation, the operation of the cell phone is made very convenient to the user.

Additionally, in FIG. 4C, multiple touch pads P1 and multiple touch pads P2 are alternatively disposed on the surface F5. For example, when the user touches the touch pads P1 and P2 within different blocks on the surface F5 with his hand, the cell phone can identify the touched block according to the touch voltage signal S1 from different source and execute a specific function (for example, dialing a number or sending an Email) accordingly.

In summary, in the present invention, separate touch pads and an impedance unit having a resistance greater than that of an input tool are adopted to reduce the power consumption. Power is consumed only when the input tool touches a first touch pad and a second touch pad at the same time. Thus, the working and standby time of a handheld apparatus is prolonged. Additionally, since two touch pads have to be simultaneously touched to make the handheld apparatus to execute a specific function, the situation that an operation is mistakenly performed is avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A handheld apparatus, comprising:
    at least one first touch pad, coupled to a first reference voltage;
    at least one current-limiting protection unit, coupled between the first reference voltage and the first touch pad, limiting a quantity of current flowing from the first reference voltage through the first touch pad into ground when the first touch pad is short-circuited and is therefore directly grounded;
    at least one second touch pad;
    at least one impedance unit, coupled between the second touch pad and a second reference voltage, wherein when an input tool touches the first touch pad and the second touch pad simultaneously, a touch voltage signal is generated on a common contact of the second touch pad and the impedance unit, and a resistance of the impedance unit is greater than a resistance of the input tool;

a microprocessor, coupled to the second touch pad, executing a specific function according to the touch voltage signal; and a voltage supply unit, coupled to the microprocessor, generating the first reference voltage and the second reference voltage, and controlled by the microprocessor to turn on the first reference voltage and the second reference voltage periodically when the handheld apparatus is in a power-saving mode or a sleep mode to reduce power consumption of the handheld apparatus.

2. The handheld apparatus according to claim 1, further comprising:
a timing unit, coupled to the microprocessor, wherein the microprocessor controls the timing of the first reference voltage and the second reference voltage generated by the voltage supply unit according to a time period counted by the timing unit.

3. The handheld apparatus according to claim 1, wherein the current-limiting protection unit comprises a first resistor.

4. The handheld apparatus according to claim 1, wherein the resistance of the impedance unit is greater than a sum of a resistance of the current-limiting protection unit and the resistance of the input tool.

5. The handheld apparatus according to claim 1, wherein the first reference voltage is greater than the second reference voltage, and the touch voltage signal rises from a logic low level to a logic high level.

6. The handheld apparatus according to claim 1, wherein the first reference voltage is smaller than the second reference voltage, and the touch voltage signal falls from a logic high level to a logic low level.

7. The handheld apparatus according to claim 1, further comprising:

at least one logic gate, coupled between the corresponding second touch pad and the microprocessor, enhancing a driving capability of the touch voltage signal and providing electrostatic discharge (ESD) protection.

8. The handheld apparatus according to claim 7, wherein the logic gate is an inverter.

9. The handheld apparatus according to claim 1, further comprising:
at least one analog-to-digital converter (ADC), coupled between the corresponding second touch pad and the microprocessor, converting the touch voltage signal corresponding to the second touch pad into a digital signal.

10. The handheld apparatus according to claim 1, wherein the impedance unit comprises a second resistor; and the input tool is a finger.

11. The handheld apparatus according to claim 1, further comprising:
a body, having a first surface, wherein a plurality of the first touch pads and a plurality of the second touch pads are alternatively disposed on the first surface.

12. The handheld apparatus according to claim 1, further comprising:
a body, having a second surface and a third surface opposite to each other, wherein the first touch pad and the second touch pad are respectively disposed on the second surface and the third surface.

13. The handheld apparatus according to claim 12, wherein the body further comprises a fourth surface and a fifth surface opposite to each other, the fourth surface adjoins the second surface and the third surface, the fifth surface also adjoins the second surface and the third surface, and another said first touch pad and another said second touch pad are respectively disposed on the fourth surface and the fifth surface.

* * * * *